(12) United States Patent
Soga et al.

(10) Patent No.: US 12,341,426 B2
(45) Date of Patent: Jun. 24, 2025

(54) SEMICONDUCTOR DEVICE, ELECTRONIC DEVICE, AND METHOD OF SETTING CHARACTERISTICS OF ELECTRONIC DEVICE

(71) Applicant: LAPIS Technology Co., Ltd., Yokohama (JP)

(72) Inventors: Ryuu Soga, Yokohama (JP); Tomoyuki Maeda, Yokohama (JP)

(73) Assignee: LAPIS Technology Co., Ltd., Yokohama (JP)

( * ) Notice: Subject to any disclaimer, the term of this patent is extended or adjusted under 35 U.S.C. 154(b) by 101 days.

(21) Appl. No.: 18/468,738

(22) Filed: Sep. 18, 2023

(65) Prior Publication Data

US 2024/0106327 A1   Mar. 28, 2024

(30) Foreign Application Priority Data

Sep. 28, 2022   (JP) ................................ 2022-155406

(51) Int. Cl.
*H02M 3/156* (2006.01)
*H02M 1/00* (2006.01)

(52) U.S. Cl.
CPC ......... *H02M 3/156* (2013.01); *H02M 1/0012* (2021.05)

(58) Field of Classification Search
None
See application file for complete search history.

(56) References Cited

U.S. PATENT DOCUMENTS 11,929,755 B2 *   3/2024   Vishwanath ............ G05F 1/567

FOREIGN PATENT DOCUMENTS

JP            2008053259        3/2008

* cited by examiner

*Primary Examiner* — Jeffrey S Zweizig
(74) *Attorney, Agent, or Firm* — JCIPRNET

(57) ABSTRACT

A semiconductor device includes: a storage circuit configured to be connected to a regulator circuit having characteristics to be identified using one or more values and store values identifying characteristics of the regulator circuit; and an electronic fuse controller including an input configured to be connected to an electronic fuse circuit including one or more electronic fuses, an output configured to be connected to the storage circuit, a reading control circuit, and a characteristic control circuit, in which the reading control circuit includes a reading circuit configured to read values from at least part of the electronic fuses through the input in a reading period, and the characteristic control circuit is configured to generate identification data configured to identify the characteristics based on a signal from the reading circuit and supply the identification data to the storage circuit through the output in an identifying period different from the reading period.

14 Claims, 9 Drawing Sheets

SEMICONDUCTOR DEVICE, ELECTRONIC DEVICE, AND METHOD OF SETTING CHARACTERISTICS OF ELECTRONIC DEVICE

CROSS-REFERENCE TO RELATED APPLICATION

This application claims the priority benefit of Japan application serial no. 2022-155406, filed on Sep. 28, 2022. The entirety of the above-mentioned patent application is hereby incorporated by reference herein and made a part of this specification.

BACKGROUND

Technical Field

The present disclosure relates to a semiconductor device, an electronic device, and a method of setting characteristics of an electronic device.

Related Art

Patent Document 1 (Japanese Patent Application Laid-Open No. 2008-53259) discloses a semiconductor integrated circuit including a laser fuse circuit, an electrical fuse circuit, and an adjustment circuit. In this semiconductor integrated circuit, the laser fuse circuit causes a first trimming code to be stored by performing laser emission. The electrical fuse circuit causes a second trimming code to be stored by applying a voltage. The adjustment circuit adjusts an electric potential level or a timing in accordance with the first or second trimming code. According to this semiconductor integrated circuit, a test time can be shortened, and reliability can be improved.

Among circuits in a semiconductor device, there are circuits of which characteristics can be configured to have high precision through trimming, and there are cases in which such high precision is required. Characteristics data for trimming is different for each individual semiconductor device. In order to record data of each individual semiconductor device in the semiconductor device, a metal fuse (a laser blown fuse) can be used. However, the use of a metal fuse obstructs reduction of a chip area of a semiconductor device according to miniaturization of the process.

An example relating to a change of circuit characteristics using a metal fuse is as below. A semiconductor device, for example, integrates circuits such as an oscillator and a voltage regulator having characteristics to be identified using one or a plurality of values. After power is input to a semiconductor device, in order to read trimming data from a controller chip, a power source voltage is applied. Trimming data from a metal fuse is read, and the trimming data, for example, is set for identifying circuit characteristics of an oscillator and a voltage regulator. Programming of a metal fuse is performed without operating a voltage regulator representing characteristics that have not been set and changes a voltage regulator representing characteristics that have not been set to a voltage regulator representing characteristics of which setting has been completed. The use of a metal fuse enables trouble with unknown characteristics of a voltage regulator that has not been set to be avoided. However, it is desired to use a method not using a metal fuse.

SUMMARY

According to a first aspect of the present disclosure, there is provided a semiconductor device including: a storage circuit configured to be connected to a regulator circuit having characteristics to be identified using one or a plurality of values and store values identifying the characteristics of the regulator circuit; and an electronic fuse controller including an input configured to be connected to an electronic fuse circuit including one or a plurality of electronic fuses, an output configured to be connected to the storage circuit, a reading control circuit, and a characteristic control circuit, in which the reading control circuit includes a reading circuit configured to read values from at least part of the electronic fuses through the input in a reading period, and the characteristic control circuit is configured to generate identification data configured to identify the characteristics based on a signal from the reading circuit and supply the identification data to the storage circuit through the output in an identifying period different from the reading period.

According to a second aspect of the present disclosure, there is provided an electronic device including: the semiconductor device according to the first aspect; and an electronic fuse device including the electronic fuse circuit.

According to a third aspect of the present disclosure, there is provided a method of setting characteristics of an electronic device, the method including: preparing the electronic device according to the second aspect; performing first power supply from a power supply to the electronic device; performing second power supply from the regulator circuit to the electronic fuse controller and the storage circuit in response to the first power supply; generating the identification data by reading the values from the electronic fuses after the second power supply; and supplying the identification data to the storage circuit.

BRIEF DESCRIPTION OF THE DRAWINGS

Each of FIG. 6A

DESCRIPTION OF THE EMBODIMENTS

Embodiments of the disclosure provide a semiconductor device, an electronic device, and a method of setting characteristics of an electronic device capable of changing characteristics of a circuit after a process of manufacturing a semiconductor device including a circuit having characteristics to be identified using one or a plurality of values.

Hereinafter, each embodiment for performing the present disclosure will be described with reference to the drawings.

Figure 1:
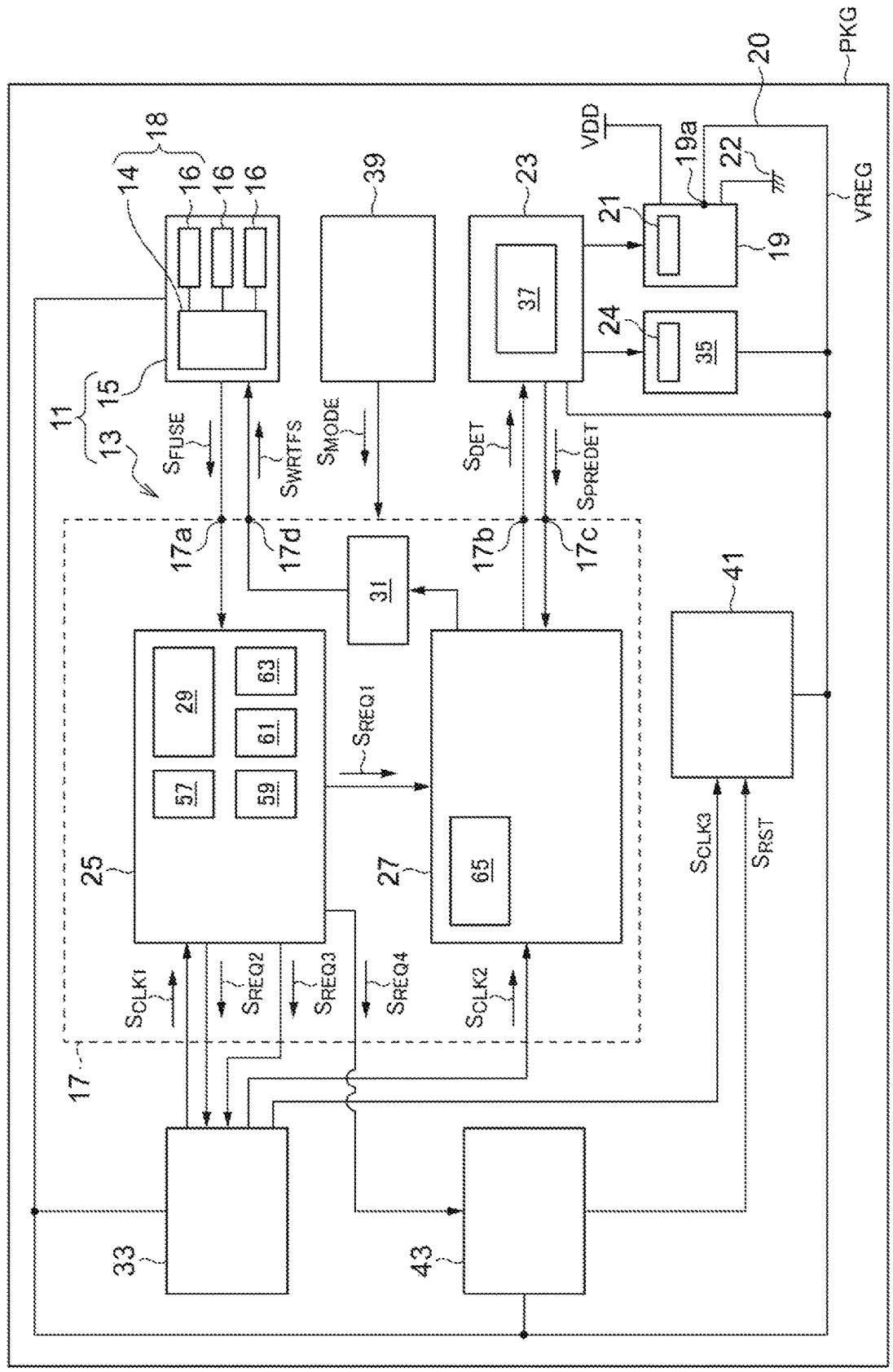
FIG. 1 is a diagram schematically illustrating a semiconductor device and an electronic device according to this embodiment.

FIG. 1 is a diagram schematically illustrating a semiconductor device and an electronic device according to this embodiment.

The electronic device 11 includes a semiconductor device 13 and an electronic fuse device 15. The semiconductor device 13 includes an electronic fuse controller 17 and a storage circuit 23. The electronic fuse device 15 includes a control circuit 14 and one or a plurality of electronic fuses 16. The control circuit 14 is connected to the electronic fuses 16 and controls an access to the electronic fuses 16. The electronic fuse device 15 may be integrated on a single semiconductor substrate together with the semiconductor device 13 or may be configured as a separate body without being integrated. As necessary, at least one of the electronic device 11, the semiconductor device 13, and the electronic fuse device 15 may be disposed inside a package PKG.

According to the electronic device 11, in a circuit having characteristics to be identified using one or a plurality of values, values for identifying the characteristics of the circuit can be stored and held using the electronic fuse device 15. In an embodiment presented in the following description, although this circuit includes a regulator circuit 19, the configuration is not limited to the regulator circuit 19. The storage circuit 23 is connected to a circuit having characteristics to be identified using one or a plurality of values.

In this embodiment, the storage circuit 23 is connected to the regulator circuit 19 having characteristics to be identified using one or a plurality of values. The regulator circuit 19 has characteristics to be identified using one or a plurality of values and, for example, has characteristics such as a reference voltage and a temperature coefficient (temperature gradient). The storage circuit 23 is configured to store values identifying characteristics of the regulator circuit 19. The regulator circuit 19 has one or a plurality of trimmable circuits 21 that are identified using set values supplied by the storage circuit 23.

The regulator circuit 19 receives supply of electric power from a power supply VDD and supplies a controlled voltage VREG to a power supply line 20 through an output (19a). In FIG. 1, representatively, a second power supply line 22, for example, a ground line connected to the regulator circuit 19 is drawn.

The electronic fuse controller 17 includes a reading control circuit 25 and a characteristic control circuit 27. In addition, the electronic fuse controller 17 includes an input 17a connected to an output of the electronic fuse circuit 18, an output 17b connected to the storage circuit 23, an input 17c connected to the storage circuit 23, and an output 17d connected to an input of the electronic fuse circuit 18.

The reading control circuit 25 includes a reading circuit 29, and the reading circuit 29 is configured to read a signal $S_{FUSE}$ having a value from at least a part of the electronic fuses 16 through the input 17a in a reading period.

The characteristic control circuit 27 generates identification data STET configured to identify characteristics of a circuit, more specifically, characteristics of the regulator circuit 19 based on a signal (the value thereof is the same as that of the signal $S_{FUSE}$) from the reading control circuit 25, more specifically, the reading circuit 29 receiving the signal $S_{FUSE}$. In addition, the characteristic control circuit 27 is configured to supply identification data $S_{DET}$ to the storage circuit 23 through the output 17b during a specific period different from the reading period such that the characteristics of the regulator circuit 19 are identified.

According to the electronic device 11, the semiconductor device 13, and the electronic fuse device 15, before characteristics of the regulator circuit 19 to be identified are identified as identification data $S_{DET}$, the characteristics of the regulator circuit 19 are defined using default values, and the regulator circuit 19 operates in accordance with these values. After the characteristics of the regulator circuit 19 are identified using the values of the storage circuit 23, the characteristics of the regulator circuit 19 are defined using values of one or a plurality of electronic fuses 16 inside the electronic fuse device 15, and the regulator circuit 19 operates in accordance with these characteristics.

The reading circuit 29 reads a signal $S_{FUSE}$ from at least a part of the electronic fuses 16 among the electronic fuse circuits 18 through the input 17a of the electronic fuse controller 17, and the reading control circuit 25 generates data $S_{DATA}$ supplied to the characteristic control circuit 27 from the signal $S_{FUSE}$. In addition, the reading control circuit 25 supplies data $S_{DATA}$ from the signal $S_{FUSE}$ to the characteristic control circuit 27. The characteristic control circuit 27 converts the data $S_{DATA}$ from the signal $S_{FUSE}$ supplied by the electronic fuse circuit 18 into identification data $S_{DET}$ configured to identify characteristics of the regulator circuit 19. The identification data $S_{DET}$ is supplied to a holding circuit of the storage circuit 23 associated with the regulator circuit 19 through the output 17b of the electronic fuse controller 17 such that characteristics of the circuit are identified. In accordance with provision of the identification data $S_{DET}$, the characteristics of the regulator circuit 19 are identified, and the regulator circuit 19 can operate in accordance with the identified characteristics.

Characteristic values for causing the regulator circuit 19 to exhibit desired characteristics are identified as below. Characteristics of a circuit, more specifically, the regulator circuit 19 can be measured. For example, the characteristics of the regulator circuit 19 are measured using a tester in a manufacturing process. When a semiconductor device including the regulator circuit 19 is disposed inside a package, measurement is performed through terminals of the package. Alternatively, certain circuit characteristics to be identified using one or a plurality of values can be acquired by setting certain values in the storage circuit 23 and measuring characteristics of the regulator circuit 19 for these values. A tester may be used in this measurement. From measurement performed once or several times, desired setting values relating to causing of the regulator circuit 19 to exhibit desired characteristics can be identified. When the regulator circuit 19 exhibiting desired characteristics is acquired, the values of the storage circuit 23 are identified.

One or a plurality of desired setting values identified as described above are supplied from the tester to a writing circuit 31 as a setting value signal $S_{PREDET}$. The writing circuit 31 generates a fuse value signal $S_{WRTFS}$ from the setting value signal $S_{PREDET}$ received from the characteristic control circuit 27 and supplies the generated fuse value signal to the electronic fuse device 15. In response to reception of the fuse value signal $S_{WRTFS}$, the electronic fuse device 15 records the value of the fuse value signal $S_{WRTFS}$ in one or a plurality of electronic fuses 16 corresponding thereto.

As necessary, the oscillator 35 can have characteristics to be identified using one or a plurality of values, for example, characteristics of a frequency and an oscillation period. The storage circuit 23 may be configured to store values identifying the characteristics of the oscillator 35. The oscillator 35 may include one or a plurality of trimmable circuits 24 identified using setting values supplied by the storage circuit 23. The characteristics of the oscillator 35 are measured using a tester in a manufacturing process. When a semiconductor device including the oscillator 35 is disposed inside a package, measurement is performed through terminals of the package.

In the following description, as necessary, the identification data $S_{DET}$ may be converted into data relating to one or a plurality of values for identifying characteristics of the regulator circuit 19 and further include data relating to one or a plurality of values for identifying characteristics of the oscillator 35, may further include data relating to one or a plurality of values for identifying characteristics of the oscillator 35 in addition to data relating to one or a plurality of values for identifying characteristics of the regulator circuit 19, or may further include data relating to one or a plurality of values for identifying characteristics of other circuits in addition to these. Before characteristics of the oscillator 35 to be identified are identified as the identification data $S_{DET}$, the characteristics of the oscillator 35 are defined using default values, and the oscillator 35 operates in accordance with these values. After the characteristics of the oscillator 35 are identified using values of the storage circuit 23 storing the identification data $S_{DET}$, the characteristics of the oscillator 35 are defined using a value of one or a plurality of electronic fuses 16 inside the electronic fuse device 15, and the oscillator 35 operates in accordance with these characteristics. The characteristics of the oscillator 35 can be identified in a manner similar to that of the characteristics of the regulator circuit 19 described above. In the following description, the regulator circuit 19 will be described.

The semiconductor device 13 includes a clock generating circuit 33, and the clock generating circuit 33 may include an oscillator 35. The electronic fuse controller 17 operates in accordance with reception of a first clock signal $S_{CLK1}$ from the clock generating circuit 33, and the characteristic control circuit 27 operates in accordance with reception of a second clock signal $S_{CLK2}$ from the clock generating circuit 33. The clock generating circuit 33 can receive electric power from the power supply line 20 connected to the regulator output 19a of the regulator circuit 19.

According to the electronic device 11, the semiconductor device 13, and the electronic fuse device 15, the clock generating circuit 33, for example, operates by receiving the voltage VREG of the power supply line 20 from the regulator circuit 19 that is in a default state.

The storage circuit 23 includes a volatile holding circuit 37, and the volatile holding circuit 37 is configured to store one or a plurality of values of the characteristics of the regulator circuit 19. The volatile holding circuit 37 is connected to the output 17b of the electronic fuse controller 17. The volatile holding circuit 37 can receive electric power from the power supply line 20 connected to the regulator output 19a of the regulator circuit 19.

According to the electronic device 11, the semiconductor device 13, and the electronic fuse device 15, values from the electronic fuses 16 are stored in the volatile holding circuit 37 (for example, a latch circuit or a flipflop circuit) for setting the characteristics of the trimmable circuit 21 of the regulator circuit 19.

The semiconductor device 13 may include an additional circuit 41 that is separate from the electronic fuse controller 17. The additional circuit 41 receives supply of electric power from the power supply line 20 and exhibits main functions thereof in a normal operation mode.

The semiconductor device 13 may further include a control circuit 39 configured to generate a mode signal $S_{MODE}$, and the control circuit 39 is configured to perform switching between a setting mode of the semiconductor device 13 and a normal operation mode different from this setting mode. In the setting mode, the characteristics of the regulator circuit 19 are identified in accordance with values of the identification data $S_{DET}$ corresponding to the characteristics being stored in the storage circuit 23. In the normal operation mode in which a normal operation is performed, the regulator circuit 19 exhibits characteristics defined by stored values in the storage circuit 23 and supplies electric power to the clock generating circuit 33, the oscillator 35, the additional circuit 41, and the reset circuit 43.

The semiconductor device 13 may include a reset circuit 43 configured to supply a reset signal $S_{RST}$ to the additional circuit 41. The additional circuit 41 receives a third clock signal $S_{CLK3}$ from the clock generating circuit 33 in the normal operation mode. On the other hand, in the setting mode, the clock generating circuit 33 may not supply the third clock signal $S_{CLK3}$ to the additional circuit 41. In such a case, a change in the load of the regulator circuit 19 due to the operation of the additional circuit 41 can be avoided.

The electronic fuse controller 17 can receive electric power from the regulator circuit 19.

According to the electronic device 11, the semiconductor device 13, and the electronic fuse device 15, the electronic fuse controller 17 receives supply of electric power from the regulator circuit 19 that operates in accordance with characteristics that have not been set in the setting mode. The characteristics of the regulator circuit 19 in the setting mode are different from the characteristics of the regulator circuit 19 in the normal operation mode.

Figure 2:
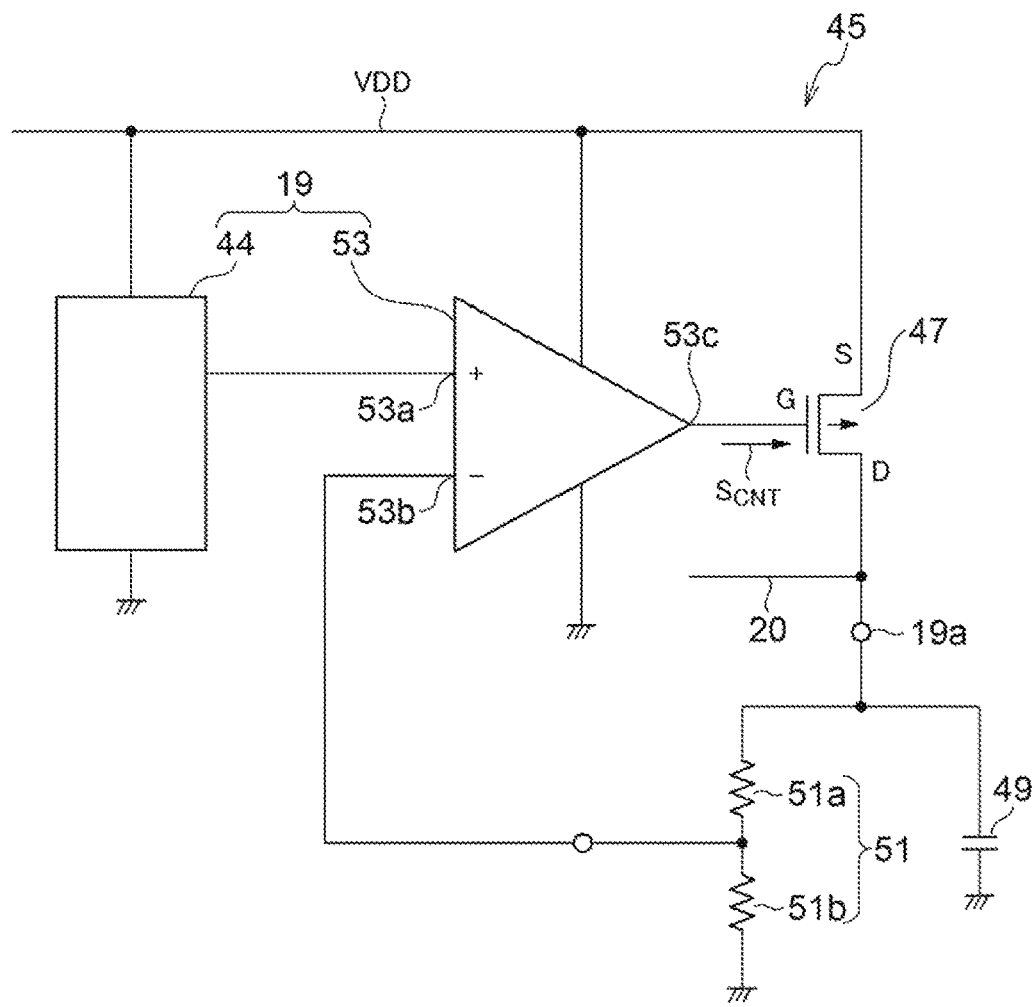
FIG. 2 is a diagram schematically illustrating a regulator according to this embodiment.

FIG. 2 is a diagram schematically illustrating a regulator according to this embodiment. Referring to FIG. 2, the voltage regulator 45 includes a regulator circuit 19, a drive circuit including a drive transistor 47, a capacitor 49, and a voltage dividing circuit 51. In this embodiment, the capacitor 49 and the voltage dividing circuit 51 are connected to the regulator output 19a and may be a separate body assembled into the same package in which the electronic device 11 and the semiconductor device 13 are disposed without being integrated with the electronic device 11 and the semiconductor device 13. The regulator circuit 19 includes an error amplifying circuit 53 and a reference voltage circuit 44 and may further include a drive transistor 47. The error amplifying circuit 53 receives a reference voltage from the reference voltage circuit 44 to a +input 53a, receives a feedback voltage from the voltage dividing circuit 51 to a −input 53b, and generates a control signal $S_{CNT}$ corresponding to a difference thereof at an output 53c. The control signal $S_{CNT}$ is supplied to a gate G of the drive transistor 47 and is used for controlling the drive transistor 47. A source S of the drive transistor 47 receives supply of electric power from the power supply VDD, and a drain D of the drive transistor 47 supplies a voltage VREG defined using a function of the regulator circuit 19 to the regulator output 19a. The drive transistor 47 may be included in the semiconductor device 13. The reference voltage circuit 44, the drive transistor 47, and the error amplifying circuit 53 receive electric power from a power supply (a power supply voltage VDD).

The electronic device 11, the semiconductor device 13, and the electronic fuse device 15 will be described with reference to FIG. 1 again.

In order to identify one among one or a plurality of values, the reading control circuit 25 may include a redundant configuration for an error correction, more specifically, an error correcting circuit 61. An exemplary redundant configuration may include a majority circuit configured to generate a majority value of read values from an odd number of electronic fuses 16. In a case in which a majority rule is employed, the writing circuit 31 is configured to store a value of a single characteristic in an odd number of electronic fuses 16. The employment of redundancy is not limited to a majority rule, and, for example, another error correction such as a hamming code may be employed. In order to reliably perform calculation of an error correction, the reading control circuit 25 may include a holding circuit 63 that holds a read value from the electronic fuse 16, for example, a latch circuit or a flipflop circuit. The holding circuit 63 receives a read value from the electronic fuse 16 and supplies the read value to the error correcting circuit 61 in a calculation period of the error correcting circuit 61.

According to the electronic device 11, the semiconductor device 13, and the electronic fuse device 15, an error correction using redundancy enables a correction of unintended error in the electronic fuse 16.

After starting to read from the electronic fuse 16 or after completion of reading from the electronic fuse 16, the reading control circuit 25 sends a first request $S_{REQ1}$ to the characteristic control circuit 27. In response to this first request $S_{REQ1}$, the characteristic control circuit 27 supplies identification data $S_{DET}$ to the storage circuit 23. More specifically, in response to reception of the first request $S_{REQ1}$, the characteristic control circuit 27 supplies the identification data $S_{DET}$ to the output 17b in a certain period after the reception. In this period, the storage circuit 23 stores the identification data $S_{DE}T$ in the volatile holding circuit 37.

According to the electronic device 11, the semiconductor device 13, and the electronic fuse device 15, after completion of a read value, the characteristic control circuit 27 supplies the identification data $S_{DET}$ to the output 17b in a certain period after reception of the first request $S_{REQ1}$. In accordance with this, the storage circuit 23 can reliably take in the identification data $S_{DET}$.

When the identification data $S_{DET}$ is stored in the storage circuit 23, the trimmable circuits 21 and 24 operate to exhibit characteristics defined by the identification data $S_{DET}$.

After completion of the read value from the electronic fuse 16, the reading control circuit supplies a second request $S_{REQ2}$ to the clock generating circuit 33. In response to the second request $S_{REQ2}$, the clock generating circuit 33 stops the first clock signal $S_{CLK1}$.

The second clock signal $S_{CLK2}$ having a period longer than that of the first clock signal $S_{CLK1}$ continues to be supplied to the characteristic control circuit 27. Main operations of the characteristic control circuit 27 are performed in accordance with the second clock signal $S_{CLK2}$.

According to the electronic device 11, the semiconductor device 13, and the electronic fuse device 15, in a certain period after reception of the first request $S_{REQ1}$ in the characteristic control circuit 27, the identification data $S_{DET}$ is supplied to the output 17b, and characteristics of the circuit are identified in accordance with the identification data $S_{DET}$ in this period. In this characteristic identifying period, in order to stabilize a circuit operation for identification, the first clock signal $S_{CLK1}$ is stopped. The stopping of the first clock signal $S_{CLK1}$ decreases variations of noise and a load (the load of the regulator circuit 19) due to a transition of the first clock signal $S_{CLK1}$, and the setting mode for identifying circuit characteristics can be placed in a stable operation environment.

In addition, in accordance with the identifying of circuit characteristics, there is a likelihood of the operation of the circuit changing. The stopping of the first clock signal $S_{CLK1}$ in a period in which there is a likelihood of the operation of the circuit changing can decrease a likelihood of the electronic fuse controller 17 performing an unintended operation.

As described above, in the setting mode, the clock generating circuit 33 generates a second clock signal $S_{CLK2}$ having a period longer than that of the first clock signal $S_{CLK1}$. The characteristic control circuit 27 may include a counter circuit 65 configured to operate in response to the second clock signal $S_{SLK2}$.

In response to a change of an output value of the counter circuit 65, the characteristic control circuit 27 ends supply of the identification data $S_{DET}$ to the output 17b.

According to the electronic device 11, the semiconductor device 13, and the electronic fuse device 15, a period in which the characteristic control circuit 27 operates to supply the identification data $S_{DET}$ to the output 17b is longer than one period of the second clock signal $S_{CLK2}$. An end period of this period, for example, can be defined using a count number of the counter circuit 65 or a frequency division number of a frequency divider circuit. Since the period of the second clock signal $S_{CLK2}$ is longer than that of the first clock signal $S_{CLK1}$, a setting mode for identifying characteristics of the circuit can be placed in a stable operation environment.

In the setting mode, in response to a change of the output value of the counter circuit 65, the electronic fuse controller 17 can generate a third request $S_{REQ3}$ requesting restart of the first clock signal $S_{CLK1}$ together with ending the supply of the characteristics data $S_{DET}$ to the output 17b. In response to the third request $S_{REQ3}$, the clock generating circuit 33 restarts supply of the first clock signal $S_{CLK1}$. In addition, in response to the third request $S_{REQ3}$, the clock generating circuit 33 may be configured to start supply of the third clock signal $S_{CLK3}$ to the additional circuit 41.

According to the electronic device 11, the semiconductor device 13, and the electronic fuse device 15, the first clock signal $S_{CLK1}$ is restarted after elapse of the period for identifying characteristics, and the continuing circuit operation progresses in accordance with the first clock signal $S_{CLK1}$.

In the setting mode, the electronic fuse controller 17 can generate a fourth request $S_{REQ4}$ for requesting release of resetting of the circuit 41. In response to the fourth request $S_{REQ4}$, the reset circuit 43 is configured to release resetting of the additional circuit 41.

According to the electronic device 11, the semiconductor device 13, and the electronic fuse device 15, in response to completion of identifying of characteristics of the circuit, preparation of start of an operation of a normal mode can be caused to sequentially progress by supplying the third clock signal $S_{CLK3}$ together with performing initialization of the additional circuit 41 (for example, an internal digital circuit and/or an internal analog circuit). In accordance with this, the control circuit 39 can cause the semiconductor device 13 to transition to the normal operation mode.

Figure 3:
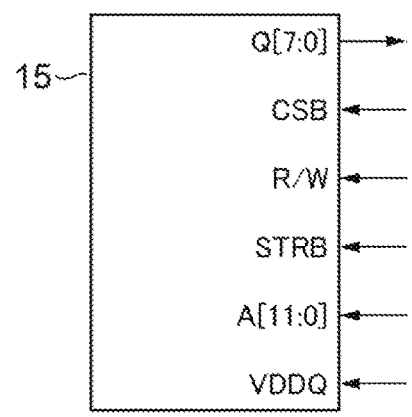
FIG. 3 is a diagram illustrating signal lines of an electronic fuse device as an example.

FIG. 3 is a diagram illustrating signal lines of an electronic fuse device as an example. The electronic fuse device 15 as an example is associated with the following signals. More specifically, the signals are a power supply voltage VDDQ, an address A[11:0] associated with the electronic fuse 16, a strobe signal STRB, a reading/writing signal R/W, a selection signal CSB of the electronic fuse device 15, and read data Q[7:0] associated with the electronic fuse 16. The electronic fuse device 15, for example, can receive electric power from the regulator circuit 19 and, as necessary, can receive electric power from the power supply voltage VDD.

As described above, in the setting mode, since it is before the characteristics of the regulator circuit 19 are set, the voltage VREG of the regulator output 19a exhibits a deviation of above ±15% with respect to a voltage value after setting of the characteristics. Since the oscillator 35 receives supply of electric power from the power supply line 20, the period of an original clock signal exhibits a deviation of about ±50%.

The electronic fuse controller 17 also operates in response to the first clock signal $S_{CLK1}$ under a voltage from the regulator circuit 19 before the setting of characteristics.

Figure 4A:
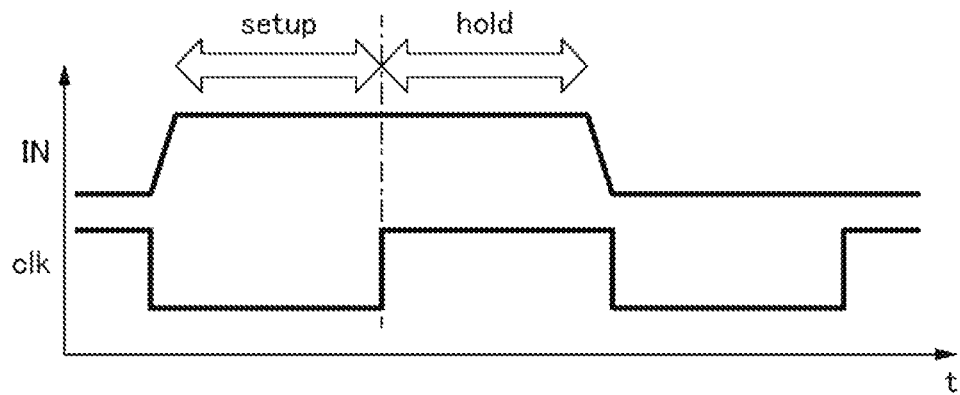
FIG. 4A and FIG. 4B are diagrams illustrating, for example, a setup period and a hold period of a flipflop circuit.
Figure 4B:
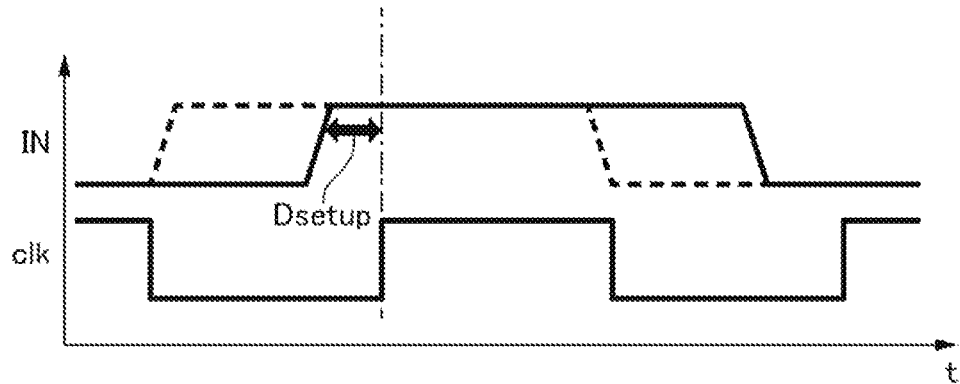
Figure 4C:
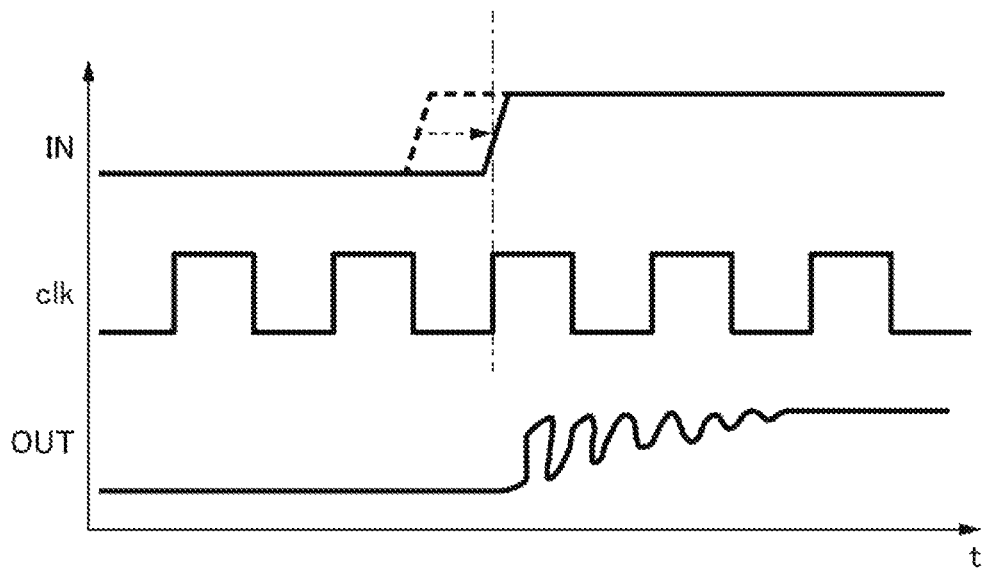
FIG. 4C is a diagram illustrating metastability due to overlapping of signal transitions.

FIG. 4A and FIG. 4B are diagrams illustrating, for example, a setup period and a hold period of a flipflop circuit. FIG. 4C is a diagram illustrating a metastable due to overlapping of signal transitions.

In a circuit timing of the electronic fuse controller 17, also the setup period (setup) and the hold period (hold), for example, become half periods in a shortest time in correspondence with a period of the original clock signal. In addition, in accordance with lowering of the voltage of the regulator output 19a, a delay of a digital circuit of the electronic fuse controller 17 increases.

Referring to FIG. 4A, a setup period and a hold period of appropriate timings are illustrated. Referring to FIG. 4B, a setup period and a hold period of a timing deviation are illustrated. A timing deviation shortens a substantial setup period Dsetup.

In accordance with a deviation of the voltage of the regulator output 19a, it can be predicted that a transition of data (IN) exactly overlaps a transition (a rise or a fall) of a clock signal (clk) or substantially overlaps the transition. As illustrated in FIG. 4C, there are cases in which overlapping between the signal transitions causes metastable to occur in taken-in data (OUT).

Figure 5A:
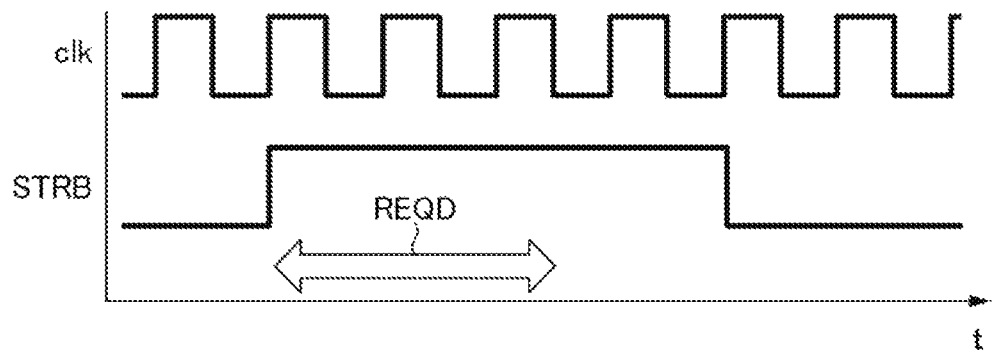
FIG. 5A is a diagram illustrating a waveform of a too-long strobe signal acquired in a case in which a period of a clock signal from an oscillator is twice a target period in a setting mode.
Figure 5B:
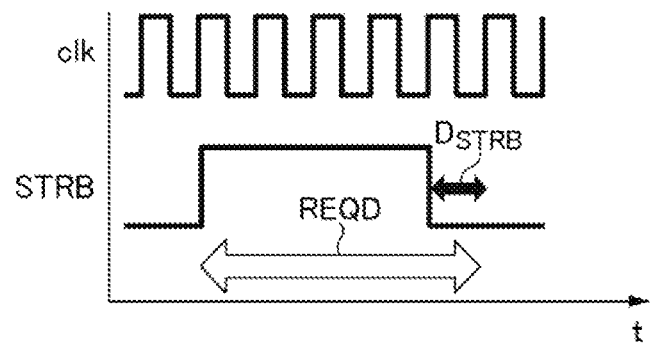
FIG. 5B is a diagram illustrating a too-short strobe signal acquired in a case in which a period of a clock signal of an oscillator is a half of a target period in a setting mode.

FIG. 5A and FIG. 5B respectively illustrates a too-long strobe signal of a case in which the period of an output waveform (clk) of the oscillator 35 is 1.5 times a specified value in a setting mode and a too-short strobe signal of a case in which the period of an output waveform (clk) of the oscillator 35 is 0.5 times the specified value in the setting mode. A large white arrow represents a required strobe signal period REQD. In a clock signal of a half period, a short period of the strobe signal STRB is shorter than a required strobe signal period REQD denoted by a large white arrow by a period $D_{STRB}$ denoted by a black arrow.

Figure 6A:
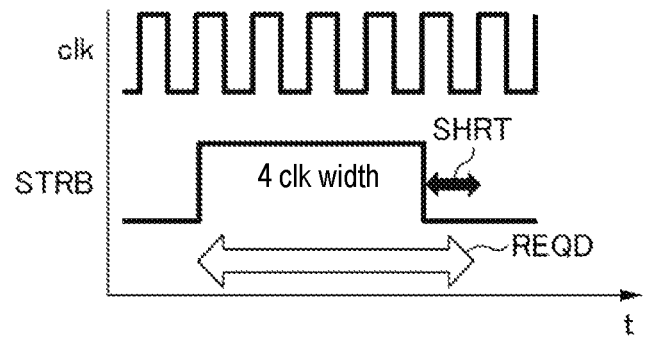
FIG. 6B is a diagram illustrating a timing of a strobe signal of an appropriate length acquired in a case in which periods of a short strobe signal and an original clock signal are a half of a target period in a case in which the period of the original clock signal is a half of the target period.
Figure 6B:
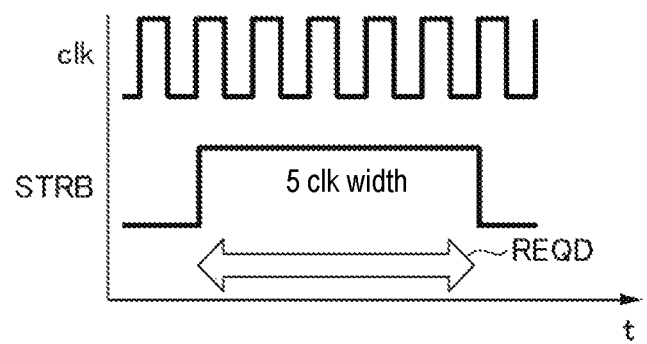

FIG. 6A and FIG. 6B illustrate two exemplary strobe signals. More specifically, FIG. 6A illustrates a timing of a strobe signal of which a length is insufficient in a case in which the period of an output waveform of an oscillator is 0.5 times a specified value. FIG. 6B illustrates a timing of a strobe signal of which a length is appropriate in a case in which the period of an output waveform of an oscillator is 0.5 times a specified value. A large white arrow represents a required strobe signal period REQD. A length of the strobe signal illustrated in FIG. 6B is longer than a length of the strobe signal illustrated in FIG. 6A by one period.

The period of a signal supplied from the electronic fuse controller 17 to the electronic fuse device 15, for example, the strobe signal STRB becomes a half period in accordance with the period of an original clock signal in a case in which the period of the original clock signal becomes a half of the original period. In a timing design following a voltage supplied from the regulator circuit 19 of which characteristics have been completed to be identified to the regulator output 19a, as illustrated in FIG. 6A, a required strobe signal period REQD is longer than a period of the strobe signal STRB relating to a voltage supplied from the regulator circuit 19 of which characteristics have not been set to the regulator output 19a by a length of a black arrow SHRT.

In an enhanced timing design of a case in which the voltage of the regulator circuit 19 having characteristics that have not been set is supplied to the regulator output 19a, as illustrated in FIG. 6B, the strobe signal STRB can be configured to be equal to or longer than the required strobe signal period REQD.

In accordance with such a design guideline, the electronic fuse controller 17 as illustrated in FIG. 1 may include a timing signal generating circuit 57 that generates a strobe signal for reading a value from the electronic fuse 16. Like the clock generating circuit 33, the timing signal generating circuit 57 receives supply of electric power from the power supply line 20 of the regulator circuit 19. More specifically, the timing signal generating circuit 57 may include counter circuits of the number of stages capable of generating a strobe signal of a desired length in a state in which the oscillator 35 oscillates at a high oscillation frequency.

The timing signal generating circuit 57 generates a strobe signal STRB on the basis of a signal from the clock generating circuit 33 as below. More specifically, the period of the strobe signal STRB satisfies a time width required for reading the electronic fuse device 15 for a range of an output voltage deviation of the regulator circuit 19 of which characteristics have not been set.

According to the electronic device 11, the semiconductor device 13, and the electronic fuse device 15, the electronic fuse device 15 can be read against an output voltage deviation of the regulator circuit 19 while receiving supply of electric power from the regulator output 19a of the regulator circuit 19 of which characteristics have not been identified.

The reading control circuit 25 may include one or a plurality of flipflop circuits 59 that receive a read value from the electronic fuse 16 separately from the holding circuit 63 of the reading control circuit 25 or inside the holding circuit 63. The flipflop circuit 59 takes in a read value in response to a strobe signal STRB.

The timing signal generating circuit 57 defines the period of the strobe signal STRB in consideration of an operation speed of the flipflop circuit 59 in the range of the output voltage deviation of the regulator circuit 19 of which characteristics have not been identified.

Figure 7:
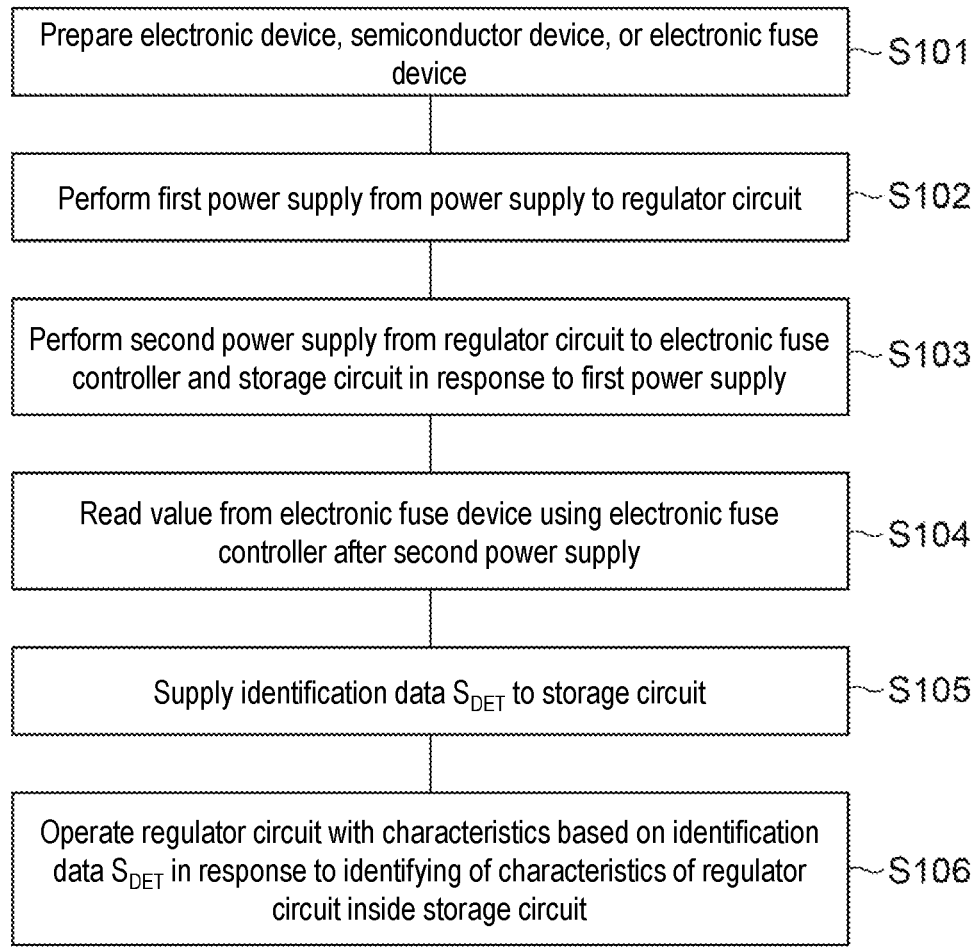
FIG. 7 is a diagram illustrating main steps in a method of setting characteristics of an electronic device according to this embodiment.

FIG. 7 is a diagram illustrating main steps of a method of setting characteristics of an electronic device according to this embodiment.

In Step S101, the electronic device 11, the semiconductor device 13, and the electronic fuse device 15 according to this embodiment are prepared. The preparation includes manufacturing of the electronic device 11, the semiconductor device 13, and the electronic fuse device 15 and obtainment of the electronic device 11, the semiconductor device 13, and the electronic fuse device 15 for free or not.

In Step S102, first power supply from a power supply (for example, the power supply voltage VDD) to the regulator circuit 19 is performed. In response to the first power supply from this power supply, the regulator circuit 19 performs a voltage regulating operation. This can be achieved by supplying electric power from the power supply to the electronic device 11, the semiconductor device 13, and the electronic fuse device 15.

In Step S103, in response to the first power supply, second power supply to the electronic device 11, the semiconductor device 13, and the electronic fuse device 15 is performed. The second power supply is power supply from the power supply line 20 connected to the regulator output 19a of the regulator circuit 19. For example, the regulator circuit 19 supplies electric power to the electronic fuse controller 17, the storage circuit 23, and the clock generating circuit 33.

In Step S104, after the second power supply, a value is read from the electronic fuse device 15 using the electronic fuse controller 17. More specifically, after supplying electric power to the semiconductor device 13 and the electronic fuse device 15, data is read from one or a plurality of electronic fuses 16. The electronic fuse controller 17 generates identification data $S_{DET}$ from values read from the electronic fuse 16.

In Step S105, the identification data $S_{DET}$ is supplied to the storage circuit 23. In accordance with storage in the storage circuit 23, characteristics of the regulator circuit 19 are identified.

In Step S106, in response to the identifying of the characteristics of the regulator circuit 19 inside the storage circuit 23, the regulator circuit 19 is operated with characteristics based on the identification data $S_{DET}$.

According to this setting method, during the operation of a circuit, characteristics of this circuit can be changed. In addition, after assembly that is a post-process, trimming of the regulator circuit 19 and the oscillator 35 can be performed. More specifically, the electronic device 11, the semiconductor device 13, and the electronic fuse device 15 that have been prepared can be arranged inside a package. In addition, in FIG. 7, main steps can be performed with "the regulator circuit 19" substituted with the "oscillator 35" or "the regulator circuit 19 and the oscillator 35". The setting described above may be performed before assembly of a semiconductor device into a package or after the assembly. The semiconductor device after assembly includes a package that houses the semiconductor device.

Figure 8:
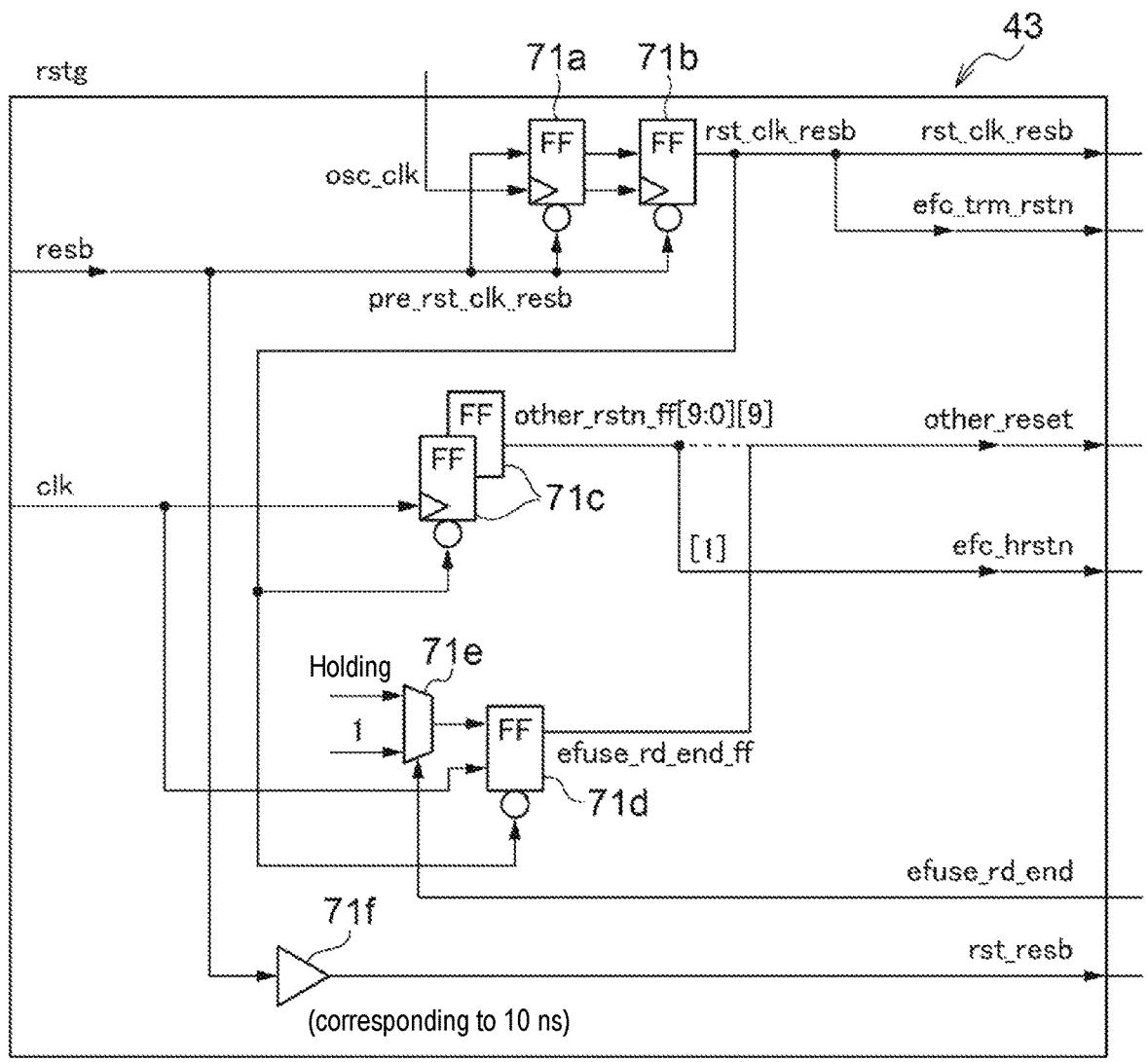
FIG. 8 is a diagram illustrating a circuit diagram of a main part of a reset circuit according to this embodiment.

FIG. 8 is a diagram illustrating a circuit diagram of a main part of the reset circuit according to this embodiment.

After completion of resetting of the entire circuit including the semiconductor device 13 and the circuit 41, the reset circuit 43 receives a reset release signal (resb). The reset release signal (resb) is input to reset inputs of flipflop circuits 71a and 71b of two stages connected in series to reset the flipflop circuits 71a and 71b. Clock inputs of first stages of the flipflop circuits 71a and 71b receive an original clock signal (osc_clk), and data inputs receive a reset release signal (resb). In accordance with this, data outputs of later stages of the flipflop circuits 71a and 71b supply a reset signal (rst_clk_resb) and a reset signal (efc_trm_rstn) generated from the reset release signal (resb).

In addition, the reset signal (rst_clk_resb) is input to a reset input of flipflop circuits 71c connected in parallel with each other inside the reset circuit 43, a clock input of such a flipflop circuit 71c receives a clock signal (clk), and a data input of the flipflop circuit 71c receives a reset release signal (resb). The flipflop circuit 71c generates a reset signal (other_reset) and a reset signal (efc_hrstn) at respective data outputs.

In addition, the reset signal (rst_clk_resb) is input to a reset input of the flipflop circuit 71d, a clock input of this flipflop circuit 71d receives a clock signal (clk), the data input of the flipflop circuit 71c is connected to a selector 71e responding to a select signal (efuse_rd_end), and, in response to the select signal (efuse_rd_end), the selector 71e supplies a holding signal or a logic value "1" to the data input of the flipflop circuit 71c. In accordance with one of the holding signal or the logic value "1" that has been received through the selector 71e, the flipflop circuit 71d generates a reset signal (efuse_rd_end_ff, other_reset) at the data output thereof.

In addition, the reset release signal (resb) is given to a delay circuit 71f (for example, a delay of 10 n seconds), and the delay circuit 71f generates a reset signal (rst_resb).

Figure 9:
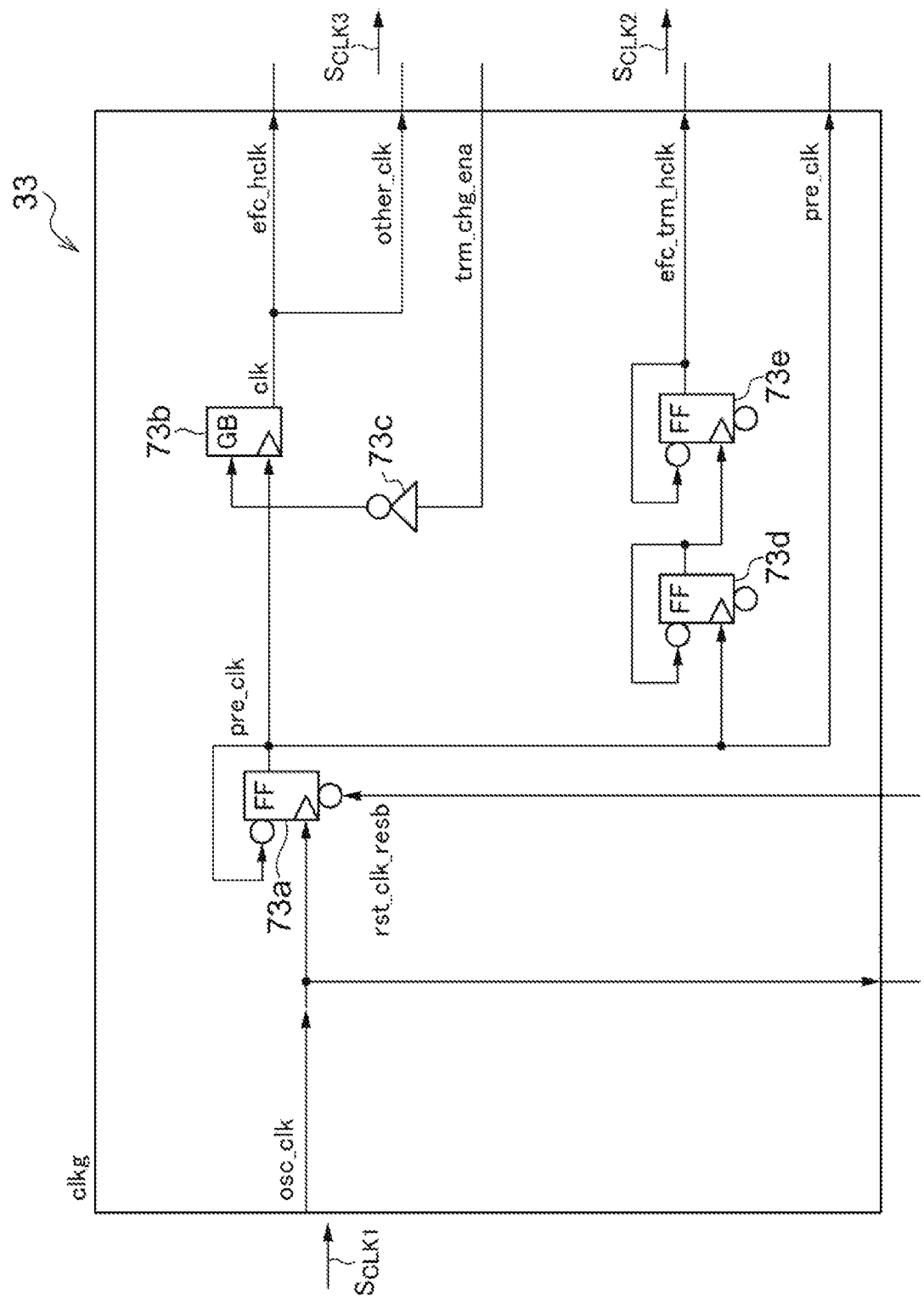
FIG. 9 is a diagram illustrating a circuit diagram of a main part of a clock generating circuit according to this embodiment.

FIG. 9 is a diagram illustrating a circuit diagram of a main part of the clock generating circuit according to this embodiment.

The clock generating circuit 33 receives an original clock signal (osc_clk). The original clock signal (osc_clk) is given to the clock input of the flipflop circuit 73a, and the reset input of the flipflop circuit 73a receives a reset signal (rst_clk_resb) from the reset circuit 43. The data output of the flipflop circuit 73a is fed back to a data negative input, and the flipflop circuit 73a operates as a frequency divider circuit and generates a frequency division signal (pre_clk).

The frequency division signal (pre_clk) is given to a clock input of a clock gating circuit 73b, and a data input of the clock gating circuit 73b receives a write enable signal (trm_chg_ena) through the inverter 73c. A data output of the clock gating circuit 73b generates a clock signal (efc_hclk) and a clock signal (other_clk).

The frequency division signal (pre_clk) is given to the clock input of the initial stage of the two-stage serial flipflop circuits 73d and 73e. Data outputs of the flipflop circuits 73d and 73e are fed back to respective data negative inputs, and each of the flipflop circuits 73d and 73e operates as a 13-divider circuit and generates a frequency division signal (efc_trm_hclk) from frequency divider circuits of two stages.

In addition, the frequency division signal (pre_clk) is output from the clock generating circuit 33 as it is.

Figure 10:
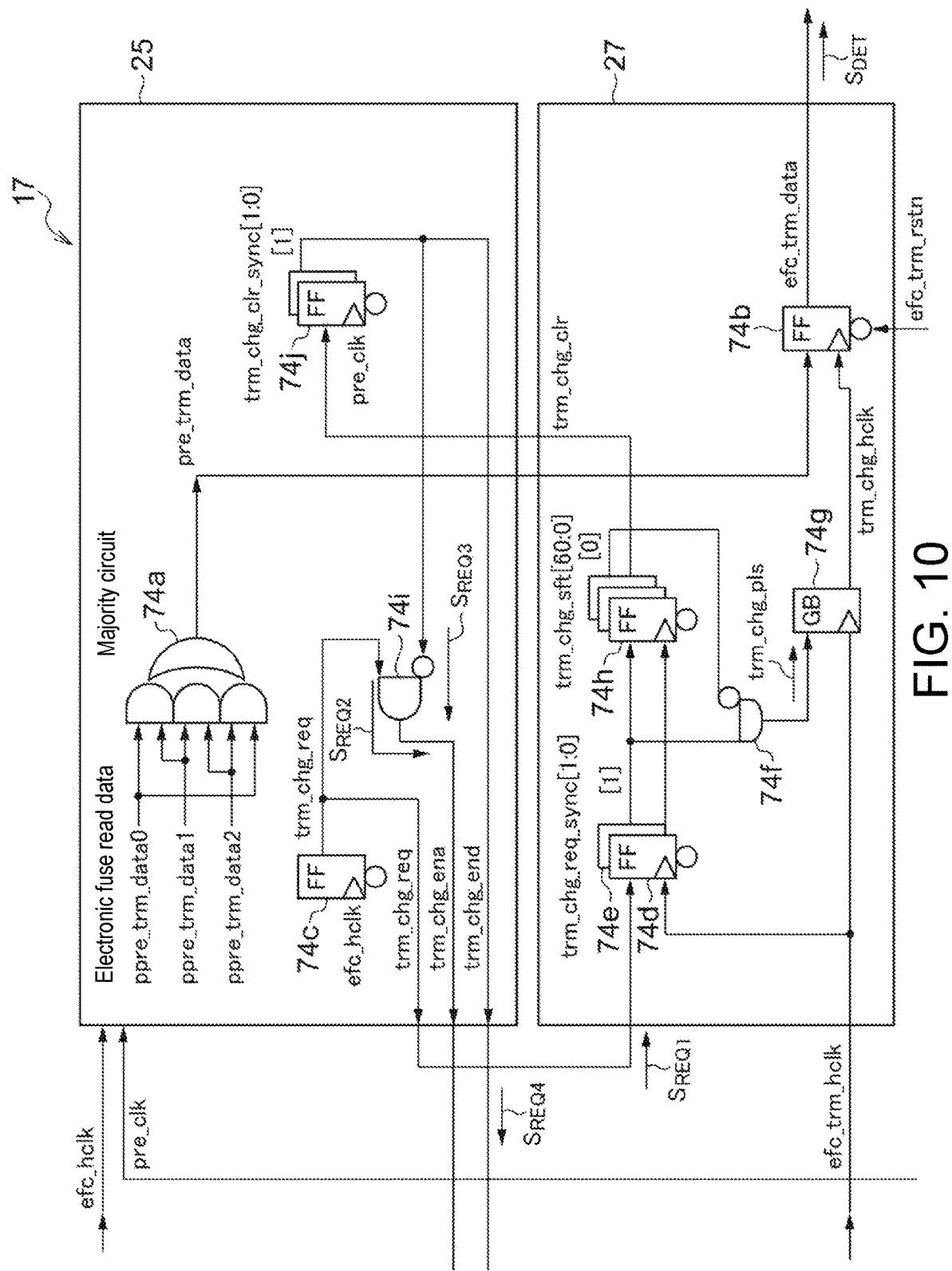
FIG. 10 is a diagram illustrating a circuit diagram of a main part of an electronic fuse controller according to this embodiment.

FIG. 10 is a diagram illustrating a circuit diagram of a main part of an electronic fuse controller according to this embodiment.

The electronic fuse controller 17 reads electronic fuse read data (ppre_trm_data0, ppre_trm_data1, and ppre_trm_data2) from the electronic fuse 16 of the electronic fuse device 15. A majority circuit 74a as an error correcting circuit receives the read electronic fuse read data (ppre_trm_data0, ppre_trm_data1, and ppre_trm_data2) and generates an error correction value (pre_trm_data). An output of the majority circuit 74a is supplied to the data input of the flipflop circuit 74b, and the data output of the flipflop circuit 74b, in response to a signal (trm_chg_hclk) to the clock input of the flipflop circuit 74b, supplies identification data $S_{DET}$ to the storage circuit 23.

A counter 74c includes a counter circuit and a flipflop circuit, and the counter circuit starts counting immediately after release of resetting of the electronic fuse controller 17 and outputs a logical value "1" after completion of a predetermined count number, and the flipflop circuit receives a value of this output and receives a clock signal (efc_hclk) at a clock input. The counter 74c generates a signal (trm_chg_req) at a data output. The signal (trm_chg_req) is a signal (for example, $S_{REQ1}$) from the reading control circuit 25 requesting the characteristic control circuit 27 to perform writing.

The signal (trm_chg_req) is input to data inputs of flipflop circuits (registers) 74d and 74e connected in parallel with each other. Clock inputs of the flipflop circuits 74d and 74e receive a clock signal (efc_trm_hclk). In synchronization of an edge of the clock signal (efc_trm_hclk), the signal (trm_chg_req) is taken into such registers (74d and 74e).

An output (a first bit [1]) of one of the resisters (74d and 74e) is connected to a shift register 74h, and the shift register 74h outputs a signal indicating an end of a write period after 60 counts of the four-divided clock.

An output (a first bit [1]) of one of the resisters (74d and 74e) is input to a data input of the initial stage of the shift register 74h, and the shift register 74h receives a clock signal (efc_trm_hclk). The output (0-th bit [0]) of the shift register 74h is connected to a negative input of a logic gate 74f. A positive input of the logic gate 74f receives a signal from one (the first bit [1]) of the registers (74d and 74e).

An output of the logic gate 74f is supplied to an input (trm_chg_pls) of a clock gating circuit 74g. In response to an output (the first bit) of one of the registers (74d and 74e) at the data input received through the logic gate 74f, the clock gating circuit 74g generates a logical value indicating a period start (start of a period) from a four-divided clock input (efc_trm_hclk) and supplies the generated logical value to the data output thereof. In addition, in response to a value from the output (the 0-th bit [0]) of the shift register 74h, the clock gating circuit 74g generates a logical value indicating a period end (end of a period) through the negative input of the logic gate 74f and supplies the generated logical value to the data output thereof. In this pulse period (one pulse from trm_chg_hclk), the flipflop circuit 74b supplies a value of the data input (specification data STET) to the output thereof.

The signal (trm_chg_req) is input to a positive input of the logic gate 74i, and the logic gate 74i generates a write enable signal (trm_chg_ena).

An output (trm_chg_clr) of the shift register 74h is connected to the data input of the initial stage of flipflop circuits 74j connected in series (trm_chg_slr_sync [1:0]). An output of an end stage of the flipflop circuits 74j connected in series supplies a write end signal (trm_chg_end), and this write end signal (trm_chg_end) is input to a negative input of a logic gate 74i. In response to the write end signal (trm_chg_end), the logic gate 74i ends the write enable signal (trm_chg_ena). The flipflop circuits 74j receive a clock signal (pre_clk).

As described above, according to this embodiment, a semiconductor device, an electronic device, and a method of setting characteristics of an electronic device capable of configuring characteristics of a circuit with high precision after a process of manufacturing a semiconductor device including the circuit having characteristics to be identified using one or a plurality of values can be provided. In addition, according to the electronic fuse 16, an occupancy area can be configured to be smaller than that of a metal fuse. More specifically, according to this embodiment, by configuring an electronic fuse controller (a correction circuit) to cause a circuit used for reading data from an electronic fuse 16 to have a margin (±50% in a clock period; a regulator voltage of ±15%), trimming data can be set in the oscillator 35 and the regulator circuit 19 using the circuit used for reading data from the electronic fuse 16. In addition, until the setting of trimming data becomes stable, operations of circuits other than the circuit used for reading data from the electronic fuse 16 are stopped. According to this embodiment, a trimming code can be provided only using the electronic fuse 16, and the circuit area can be reduced.

The present disclosure is not limited to the embodiments described above, and various changes can be made in a range not departing from the concept of the present disclosure. All of these belong to the technical idea of the present disclosure.

What is claimed is:

1. A semiconductor device comprising:
a storage circuit configured to be connected to a regulator circuit having characteristics to be identified using one or a plurality of values and store values identifying the characteristics of the regulator circuit; and
an electronic fuse controller including: an input configured to be connected to an electronic fuse circuit including one or a plurality of electronic fuses, an output configured to be connected to the storage circuit, a reading control circuit, and a characteristic control circuit,
wherein the reading control circuit includes a reading circuit configured to read values from at least part of the electronic fuses through the input in a reading period, and
wherein the characteristic control circuit is configured to generate identification data configured to identify the characteristics based on a signal from the reading circuit, and supply the identification data to the storage circuit through the output in an identifying period different from the reading period.

2. The semiconductor device according to claim 1,
wherein the electronic fuse controller operates by receiving a first clock signal from a clock generating circuit including an oscillator, and
wherein the clock generating circuit receives supply of power from a power supply line connected to a regulator output of the regulator circuit.

3. The semiconductor device according to claim 1,
wherein the storage circuit includes a volatile holding circuit configured to store the values of the characteristics, and
wherein the volatile holding circuit is connected to the output of the electronic fuse controller.

4. The semiconductor device according to claim 3, further comprising a control circuit configured to perform switching between a setting mode of the semiconductor device and a normal operation mode different from the setting mode,
wherein the characteristics are identified by storing the values of the characteristics in the storage circuit in the setting mode,
wherein the regulator circuit represents characteristics defined by the values in the storage circuit in the normal operation mode, and
wherein the electronic fuse controller receives supply of power from the regulator circuit in the setting mode.

5. The semiconductor device according to claim 1, wherein the reading control circuit further includes a majority circuit that is configured to generate a majority value of read values from an odd number of electronic fuses for identifying one of one or a plurality of the values.

6. The semiconductor device according to claim 2,
wherein, after reading from the electronic fuses is completed, the reading control circuit sends, to the characteristic control circuit, a first request for supplying the identification data to the storage circuit, and wherein, in response to reception of the first request, the characteristic control circuit supplies the identification data to the output in a certain period after the reception.

7. The semiconductor device according to claim 6,
wherein the reading control circuit supplies a second request to the clock generating circuit after completion of reading values from the electronic fuses, and
wherein the clock generating circuit stops the first clock signal in response to the second request.

8. The semiconductor device according to claim 7,
wherein the clock generating circuit generates a second clock signal with a period longer than that of the first clock signal,
wherein the characteristic control circuit further includes a counter circuit configured to operate in response to the second clock signal, and
wherein the characteristic control circuit ends supply of the identification data to the output in response to a change of an output value of the counter circuit.

9. The semiconductor device according to claim 8,
wherein the characteristic control circuit generates a third request requesting restart of the first clock signal in response to a change of the output value of the counter circuit, and
wherein the clock generating circuit restarts the first clock signal in response to the third request.

10. The semiconductor device according to claim 1, wherein the regulator circuit includes a trimmable circuit that is identified using a setting value supplied by the storage circuit.

11. An electronic device comprising:
the semiconductor device according to claim 1; and
an electronic fuse device including the electronic fuse circuit.

12. The electronic device according to claim 11, wherein the semiconductor device and the electronic fuse device are integrated on a semiconductor substrate.

13. A method of setting characteristics of an electronic device, the method comprising:
preparing the electronic device according to claim 11;
performing first power supply from a power supply to the electronic device;
performing second power supply from the regulator circuit to the electronic fuse controller and the storage circuit in response to the first power supply;
generating the identification data by reading the values from the electronic fuses after the second power supply; and
supplying the identification data to the storage circuit.

14. The method of setting characteristics of an electronic device according to claim 13, further comprising operating the regulator circuit with characteristics based on the identification data in response to supply of the identification data to the storage circuit.

* * * * *